United States Patent
Kondou

(10) Patent No.: US 10,355,717 B2
(45) Date of Patent: Jul. 16, 2019

(54) ENCODER SIGNAL PROCESSING DEVICE, ENCODER, AND SIGNAL PROCESSING METHOD AND RECORDING MEDIUM

(71) Applicant: FANUC CORPORATION, Minamitsuru-gun, Yamanashi (JP)

(72) Inventor: Youhei Kondou, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 15/666,975

(22) Filed: Aug. 2, 2017

(65) Prior Publication Data

US 2018/0041231 A1 Feb. 8, 2018

(30) Foreign Application Priority Data

Aug. 4, 2016 (JP) .................................. 2016-153817

(51) Int. Cl.
   *H03M 13/33* (2006.01)
   *H03M 13/00* (2006.01)
   *G01D 5/00* (2006.01)
   *G01D 5/244* (2006.01)

(52) U.S. Cl.
   CPC .............. *H03M 13/33* (2013.01); *G01D 5/00* (2013.01); *G01D 5/2449* (2013.01); *G01D 5/24495* (2013.01); *H03M 13/615* (2013.01)

(58) Field of Classification Search
   CPC ...................................................... H04L 7/048
   USPC ................................ 714/775, 746, 750, 776
   See application file for complete search history.

(56) References Cited

U.S. PATENT DOCUMENTS

| 4,789,948 | A | * | 12/1988 | von der Embse | ........ | H04L 1/20 375/327 |
| 6,956,505 | B2 | | 10/2005 | Taniguchi et al. | | |
| 2003/0160160 | A1 | | 8/2003 | Taniguchi et al. | | |

(Continued)

FOREIGN PATENT DOCUMENTS

| CN | 1975336 | 6/2007 |
| CN | 101253391 | 8/2008 |
| CN | 101405840 | 4/2009 |

(Continued)

OTHER PUBLICATIONS

Office Action dated Feb. 27, 2019 in Chinese Patent Application No. 201710647876.9.

*Primary Examiner* — Fritz Alphonse
(74) *Attorney, Agent, or Firm* — Wenderoth, Lind & Ponack, L.L.P.

(57) ABSTRACT

An encoder signal processing device detects position data at every predetermined time interval from an original signal which is an analog amount generated in an encoder according to movement of a measurement target. The encoder signal processing device includes: an approximate curve calculation unit that calculates an approximate curve of a detection error included in the original signal on the basis of the detection error of the position data at at least three or more points; an approximate error computation unit that computes an approximate value of the detection error of the position data at an arbitrary time point on the basis of the approximate curve of the detection error; and a position data correction unit that corrects the detection error of the position data at the arbitrary time point on the basis of the approximate value of the detection error of the position data.

8 Claims, 12 Drawing Sheets

(56) References Cited

U.S. PATENT DOCUMENTS

2010/0162086 A1\* 6/2010 Majima ................ H04L 25/067
                                                              714/780
2016/0069951 A1\* 3/2016 Yamada ............. G01R 31/2891
                                                             324/750.2

FOREIGN PATENT DOCUMENTS

| CN | 102564463 | 7/2012 |
|----|-----------|--------|
| JP | 11-249742 | 9/1999 |
| JP | 3772121   | 5/2006 |

\* cited by examiner

US 10,355,717 B2

ENCODER SIGNAL PROCESSING DEVICE, ENCODER, AND SIGNAL PROCESSING METHOD AND RECORDING MEDIUM

This application is based on and claims the benefit of priority from Japanese Patent Application No. 2016-153817, filed on 4 Aug. 2016, the content of which is incorporated herein by reference.

BACKGROUND OF THE INVENTION

Field of the Invention

The present invention relates to an encoder signal processing device, an encoder, and a signal processing method and recording medium.

Related Art

Conventionally, it is known that an encoder has a detection error which occurs in synchronization with one cycle of an original signal. This detection error occurs since the original signal is not ideal sine and cosine waves but includes an offset voltage, an amplitude difference, a phase difference, a waveform distortion, and the like. When an output signal of an encoder includes a detection error, detection accuracy of the position of a measurement target decreases. In order to correct such a detection error, according to a technique disclosed in Patent Document 1, an error amount is automatically detected and corrected at the time of operation using the fact that the detection error is synchronous with one cycle of an original signal. Moreover, in order to enhance the detection accuracy of the position detected by an encoder, according to a technique disclosed in Patent Document 2, the position data which is a detection value of an original position signal output from the encoder is interpolated with respect to an error in a position signal of the encoder, and a relation between a desired rotation position and a period taken for reaching the position is obtained on the basis of the interpolated position data.

Patent Document 1: Japanese Patent No. 03772121
Patent Document 2: Japanese Unexamined Patent Application, Publication No. H11-249742

SUMMARY OF THE INVENTION

However, in the technique disclosed in Patent Document 1, a detection error is calculated at positions located at equal intervals within one cycle, the calculated detection errors are stored in a register, detection points are linearly interpolated to calculate a detection error at an arbitrary position, and the position data are corrected thereafter. In this case, correction amounts (that is, velocity components) at fixed time intervals are constant between detection points, whereas a velocity component of a correction amount is discontinuous at a detection point and an acceleration component of a correction amount varies abruptly. Due to this, there is a possibility that this abrupt variation has an influence on a torque command of a motor that applies torque according to acceleration. In the technique disclosed in Patent Document 2, since correction is performed according to position data within one rotation of an encoder, it is difficult to eliminate a detection error occurring in synchronization with one cycle of an original signal.

An object of the present invention is to suppress a variation in an acceleration component which has an influence on a torque command when an error in an output signal of an encoder is corrected.

(1) In order to achieve the object, an encoder signal processing device (for example, an encoder signal processing device D to be described later) according to an aspect of the present invention is an encoder signal processing device (D) that detects position data at every predetermined time interval from an original signal which is an analog amount generated in an encoder according to movement of a measurement target, the encoder signal processing device including: an approximate curve calculation unit (for example, an $M^{th}$-order curve coefficient calculation circuit 51 to be described later) that calculates an approximate curve of a detection error included in the original signal generated by the encoder on the basis of the detection error of the position data at at least three or more points acquired at equal intervals within one cycle of the original signal generated by the encoder; an approximate error computation unit (for example, an $M^{th}$-order curve detection error computation circuit 52 to be described later) that computes an approximate value of the detection error of the position data at an arbitrary time point on the basis of the approximate curve of the detection error calculated by the approximate curve calculation unit; and a position data correction unit (for example, an $M^{th}$-order curve correction computation circuit 53 to be described later) that corrects the detection error of the position data at the arbitrary time point on the basis of the approximate value of the detection error of the position data computed by the approximate error computation unit.

(2) In the encoder signal processing device according to (1), the approximate curve calculation unit may calculate detection errors at respective time points obtained by evenly dividing a period between items of position data at both ends of a position data group at predetermined time intervals, the position data group being composed of at least three items of continuously detected (n+1) position data (n≥2), on the basis of values of the position group and a straight line connecting the items of position data at both ends of the position data group when the measurement target moves within a predetermined velocity range having a velocity variation within a predetermined value and calculate a detection error approximate curve that approximates detection errors at (M+1) points (W≥2) from detection errors of the position data at the (M+1) points located before and after an arbitrary time point among the time points evenly divided at the predetermined time intervals.

(3) In the encoder signal processing device according to (2), the approximate curve calculation unit may calculate an $M^{th}$-order curve that passes through the (M+1) points as the approximate curve of the detection error.

(4) In the encoder signal processing device according to (3), the $M^{th}$-order curve may be an odd-number-order curve.

(5) In the encoder signal processing device according to any one of (1) to (4), the approximate error computation unit may calculate and store detection errors at positions located at equal intervals on the basis of the approximate curve of the detection error in advance and linearly interpolate the stored detection errors to calculate the detection error at an arbitrary position.

(6) An encoder according to an aspect of the present invention is an encoder that detects position data at every predetermined time interval from an original signal which is an analog amount generated according to movement of a measurement target, the encoder including: an approximate curve calculation unit that calculates an approximate curve of a detection error included in the original signal generated by the encoder on the basis of the detection error of the position data at at least three or more points acquired at equal intervals within one cycle of the original signal generated by the encoder; an approximate error computation unit that computes an approximate value of the detection error of the position data at an arbitrary time point on the basis of the approximate curve of the detection error calculated by the approximate curve calculation unit; and a position data correction unit that corrects the detection error of the position data at the arbitrary time point on the basis of the approximate value of the detection error of the position data computed by the approximate error computation unit.

(7) A signal processing method according to an aspect of the present invention is an encoder signal processing method for detecting position data at every predetermined time interval from an original signal which is an analog amount generated in an encoder according to movement of a measurement target, the encoder signal processing method including: an approximate curve calculation step of calculating an approximate curve of a detection error included in the original signal generated by the encoder on the basis of the detection error of the position data at at least three or more points acquired at equal intervals within one cycle of the original signal generated by the encoder; an approximate error computation step of computing an approximate value of the detection error of the position data at an arbitrary time point on the basis of the approximate curve of the detection error calculated in the approximate curve calculation step; and a position data correction step of correcting the detection error of the position data at the arbitrary time point on the basis of the approximate value of the detection error of the position data computed in the approximate error computation step.

(8) A program according to an aspect of the present invention is a program for causing a computer that forms an encoder signal processing device that detects position data at every predetermined time interval from an original signal which is an analog amount generated in an encoder according to movement of a measurement target to implement: an approximate curve calculation function of calculating an approximate curve of a detection error included in the original signal generated by the encoder on the basis of the detection error of the position data at at least three or more points acquired at equal intervals within one cycle of the original signal generated by the encoder; an approximate error computation function of computing an approximate value of the detection error of the position data at an arbitrary time point on the basis of the approximate curve of the detection error calculated by the approximate curve calculation function; and a position data correction function of correcting the detection error of the position data at the arbitrary time point on the basis of the approximate value of the detection error of the position data computed by the approximate error computation function.

According to the present invention, it is possible to suppress a variation in an acceleration component which has an influence on a torque command when an error in an output signal of an encoder is corrected.

DETAILED DESCRIPTION OF THE INVENTION

An embodiment of the present invention will be described below with reference to the drawings.

First Embodiment

[Configuration]

Figure 1:
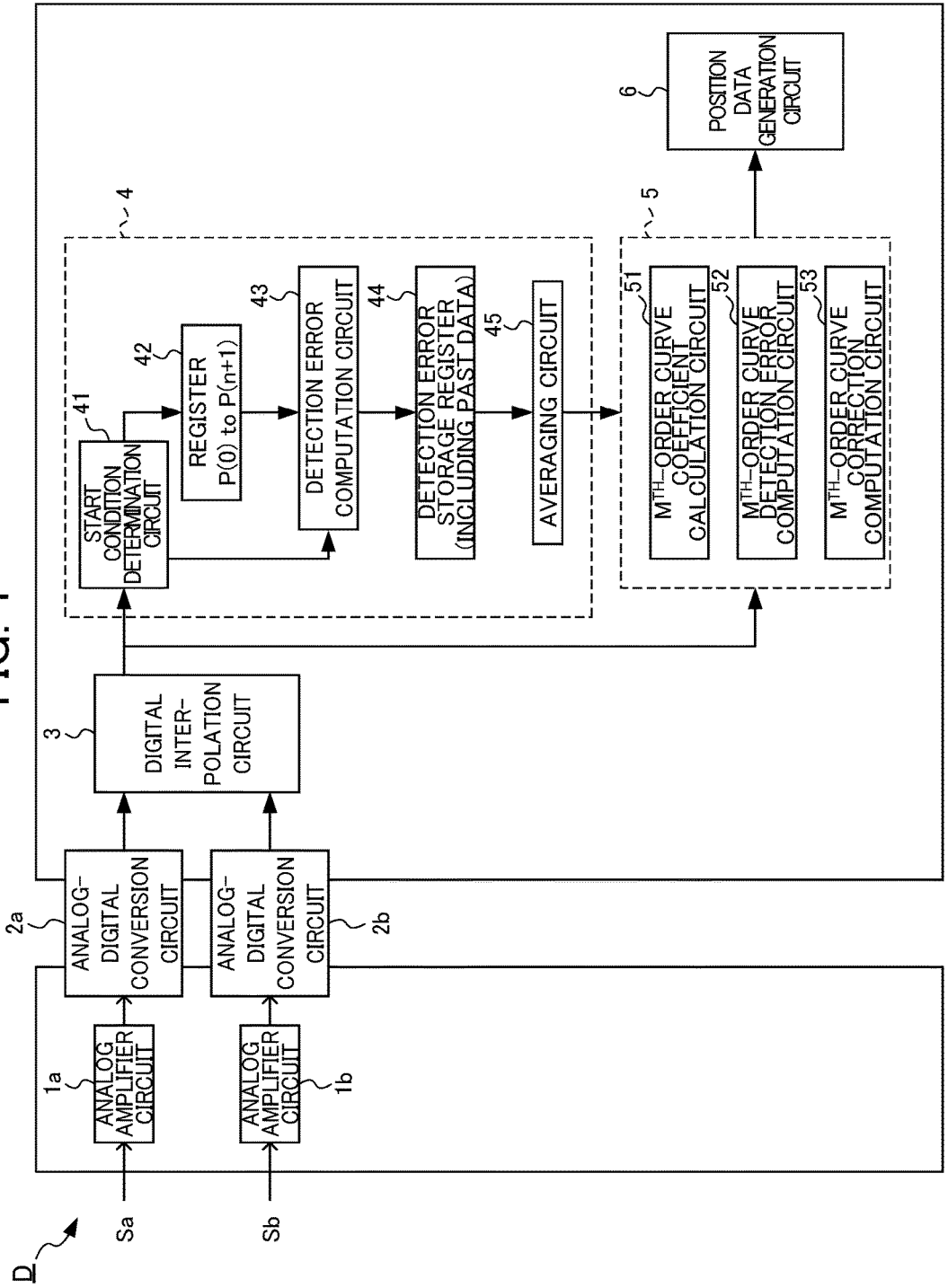
FIG. 1 is a block diagram illustrating a configuration of an encoder signal processing device according to an embodiment of the present invention.

FIG. 1 is a block diagram illustrating a configuration of an encoder signal processing device D according to an embodiment of the present invention. In the present embodiment, analog amplifier circuits 1a and 1b amplify original signals of a sine wave Sa and a cosine wave Sb output from a sensing unit of an encoder according to movement of a measurement target so as to be appropriate to be input to analog-digital conversion circuits 2a and 2b on the next stage, respectively. The analog-digital conversion circuits 2a and 2b convert the amplified analog signals to digital signals at every predetermined sampling cycle. A digital interpolation circuit 3 computes the position within one cycle of the original signal (one cycle of the sine wave) on the basis of the converted digital value and outputs the computed position to a detection error data calculation circuit 4.

The detection error data calculation circuit 4 includes a start condition determination circuit 41, a register group 42, a detection error computation circuit 43, a detection error storage register 44, and an averaging circuit 45. The start condition determination circuit 41 receives position data from the digital interpolation circuit 3 and determines whether a start condition is satisfied. When the condition is satisfied, a number of items of position data P(0) to P(n+1) which is larger by a very small number (in this example, one) than the number of samplings corresponding to one cycle of the original signal are stored in the register group 42. In this example, it is assumed that one cycle is sampled (n+1) times (n is an integer of 2 or larger).

The detection error computation circuit 43 calculates detection error data at positions located at equal intervals within one cycle on the basis of the respective states of the items of position data P(0) to P(n+1) stored in the register group 42. Moreover, the detection error storage register 44 stores the calculated past detection error data several cases back. The averaging circuit 45 averages the several cases of past detection error data stored in the detection error storage register 44 and outputs the average detection error data to the $M^{th}$-order curve coefficient calculation circuit 51 of the detection error correction circuit 5. The average of a plurality of items of detection error data is calculated in order to improve the accuracy of detection error data. For simple calculation, the detection error storage register 44 and the averaging circuit 45 may not be provided, and the detection error data calculated by the detection error computation circuit 43 may be stored in the $M^{th}$-order curve coefficient calculation circuit 51 as it is.

The detection error correction circuit 5 includes an $M^{th}$-order curve coefficient calculation circuit 51, an $M^{th}$-order curve detection error computation circuit 52, and an $M^{th}$-order curve correction computation circuit 53. The $M^{th}$-order curve coefficient calculation circuit 51 calculates a coefficient of an $M^{th}$-order curve that passes (M+1) points located before and after the detection errors stored in the detection error storage register 44. Here, M is an integer of 2 or larger. The $M^{th}$-order curve detection error computation circuit 52 calculates a detection error at an arbitrary time point on the $M^{th}$-order curve of which the coefficient is calculated by the $M^{th}$-order curve coefficient calculation circuit 51. The $M^{th}$-order curve correction computation circuit 53 calculates and corrects a detection error of the position data output from the digital interpolation circuit 3 using the detection error calculated by the $M^{th}$-order curve detection error computation circuit 52 and outputs the corrected detection error to a position data generation circuit 6. The position data generation circuit 6 generates position data on the basis of the corrected position data within one cycle and the data output from a counter (which is not illustrated in the block diagram) that measures the cycle of an original signal.

Figure 2:
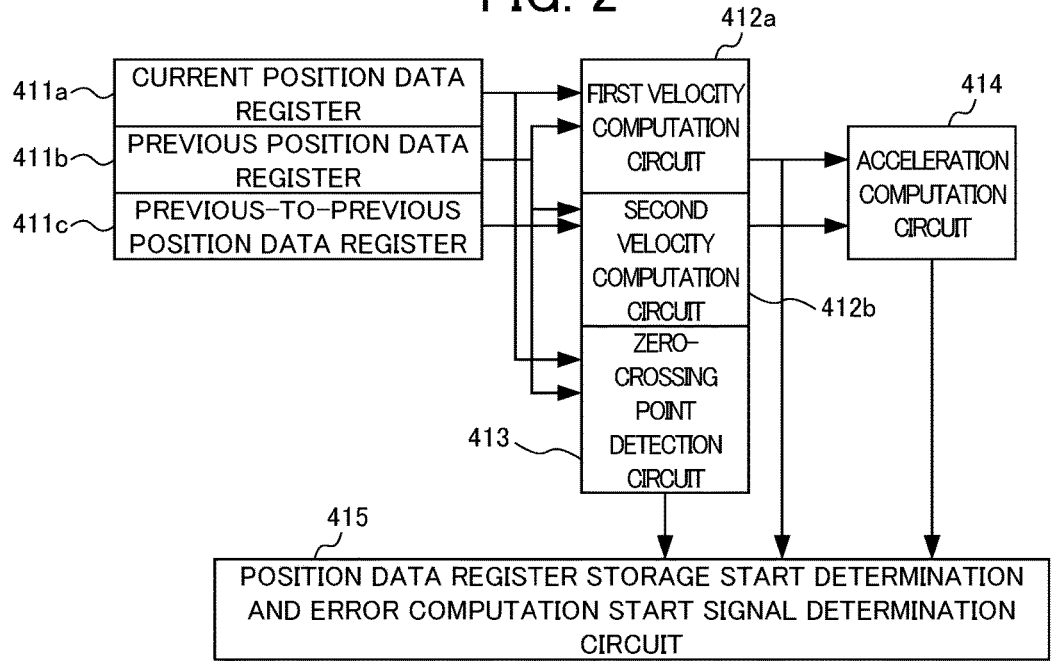
FIG. 2 is a detailed block diagram of a start condition determination circuit.

FIG. 2 is a detailed block diagram of the start condition determination circuit 41. The start condition determination circuit 41 includes three position data registers 411a, 411b, and 411c that store the position data of current, previous, and previous-to-previous sampling cycles among the items of position data output at every predetermined sampling cycle from the digital interpolation circuit 3, first and second velocity computation circuits 412a and 412b, a zero-crossing point detection circuit 413, an acceleration computation circuit 414, and a position data register storage start determination and error computation start signal determination circuit 415.

The position data for each of the predetermined sampling cycles output from the digital interpolation circuit 3 are stored in the current position data register 411a, the position data stored in the present position register 411a are stored in the previous position data register 411b, and the position data stored in the previous position data register 411b are stored in the previous-to-previous position data register 411c. In this way, the position data are shifted whenever the position data are output from the digital interpolation circuit 3 (every sampling cycle) whereby the items of position data of the current, previous, and previous-to-previous sampling cycles are stored.

The first velocity computation circuit 412a calculates a current velocity on the basis of a difference between the current position data stored in the current position data register 411a and the position data stored in the previous position data register 411b, and the second velocity computation circuit 412b calculates a current velocity of one cycle before on the basis of a difference between the items of position data stored in the previous position data register 411b and the previous-to-previous position data register 411c. Moreover, the acceleration computation circuit 414 calculates an acceleration on the basis of the difference between the velocities calculated by the first and second velocity computation circuits 412a and 412b. The zero-crossing point detection circuit 413 detects a zero-crossing point which is the start of one cycle of the original signals Sa and Sb on the basis of the items of position data stored in the current position data register 411a and the previous position data register 411c.

When the zero-crossing point is detected by the zero-crossing point detection circuit 413 on condition that a position data fetching condition is satisfied, the position data register storage start determination and error computation start signal determination circuit 415 stores position data P(0) to P(n+1) of one cycle or longer of the original signal including the detected zero-crossing point to the subsequent zero-crossing point in the register group 42. Moreover, the position data register storage start determination and error computation start signal determination circuit 415 delivers an error computation start signal to the detection error computation circuit when the subsequent zero-crossing point is detected.

The condition of position data fetching is that the velocity (the difference between position data P(−1) and P(0)) calculated by the first velocity computation circuit 412a falls within a predetermined range, and when accuracy is to be improved, an acceleration (a difference between the difference between position data P(−2) and P(−1) and the difference between P(−1) and P(0)) calculated by the acceleration computation circuit 414 falls within a predetermined range and an acceleration (a difference between position data (P(n−2) and P(n−1) and the difference between P(n−1) and P(n)) detected by the first velocity computation circuit 412a falls within a predetermined value. Hereinabove, a configuration of main parts of the encoder signal processing device D according to the present embodiment has been described. Next, various embodiments of a detection error correction method performed in this embodiment will be described.

Figure 3:
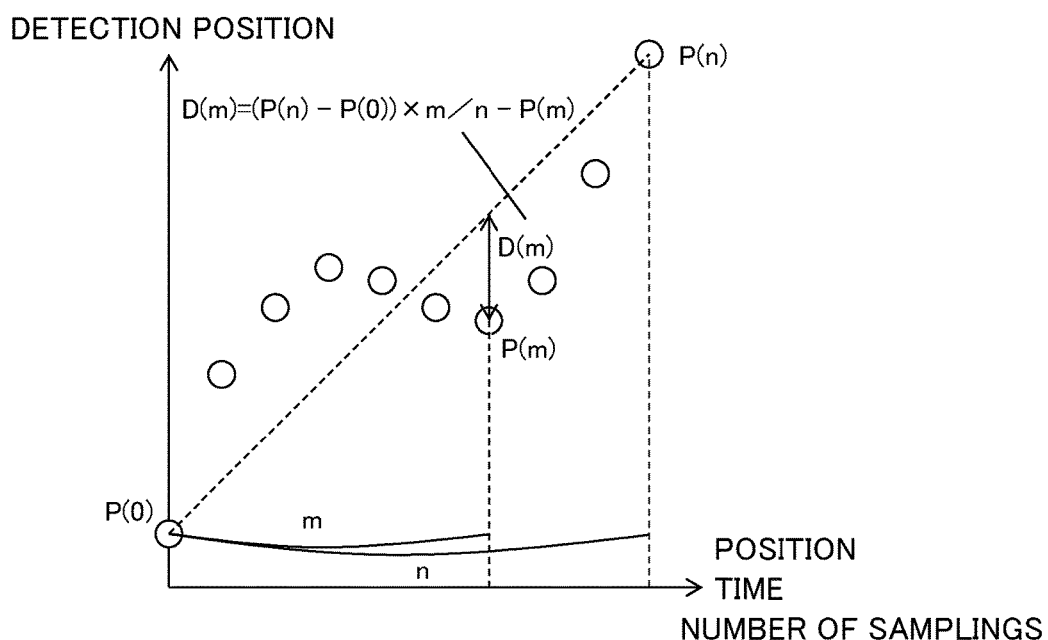
FIG. 3 is an explanatory diagram of a first embodiment of the present invention.

FIG. 3 is an explanatory diagram of a first embodiment, in which it is assumed that position data of one cycle of an original signal is obtained by n samplings. That is, it is assumed that a sampling cycle is Ts and a moving velocity of a moving object (a rotating object) to which the sensing unit of the encoder is attached is a constant velocity v. Moreover, if a moving amount (a rotation angle) of a moving object for one cycle is L, it becomes L=n·Ts·v. When the first sampling time point after a zero-crossing point is detected is time 0, and the position data sampled at this time are P(0) and the position data at the first sampling time point after the subsequent zero-crossing point is detected are P(n), a period elapsed until the position data P(n) are obtained from the position data P(0) correspond to approximately one cycle (P(n)−P(0)=L).

When items of position data for n samplings within this one cycle are plotted in a graph of which the horizontal axis is a time axis and the vertical axis is a detection position, circles are formed on a wavy curve as illustrated in FIG. 3. In FIG. 3, since items of detection position data 0 to L are repeatedly detected, the detection position data are depicted continuously on a straight line using a detection point when one cycle L is reached as the detection point "0" of the next one cycle.

Although the position data are calculated every sampling cycle Ts, since the velocity v is constant and the sampling cycle Ts is also constant, a moving distance between samplings (l=v·Ts) is constant. Therefore, the horizontal axis in FIG. 3 indicates a moving distance (a rotation angle) of a moving object. That is, $m^{th}$ sampling time point is a time point which is m·Ts later than a sampling time point at which the position data P(0) were obtained and is the position corresponding to the moving object's moving distance (the rotation angle) (l=m·v·Ts).

Since the moving object moves at a constant velocity v and moves the distance L corresponding to one cycle of the original signal in n sampling cycles Ts, the position changes linearly and the moving distance at the $m^{th}$ sampling is l=L·m/n. Therefore, if the position data P(n) has the same value as that of one cycle later of the position data P(0), the position data will be located on a straight line indicated by a broken line in FIG. 3, connecting the items of position data. P(0) and P(n). The broken straight line illustrated in FIG. 3 indicates positions that are to be detected when the moving object moves one cycle. However, when the positions which were actually sampled and detected are the position P(m) indicated by circles in FIG. 3, a detection error D(m) is calculated as below.

$$D(m)=P(m)-[P(0)+L\cdot m/n]=P(m)-[P(0)+\{P(n)-P(0)\}\times m/n] \quad (1)$$

Here, in the present embodiment, the detection error correction circuit 5 can calculate the error data D(m) at arbitrary position data P(m) without being limited to the position data which were sampled and detected and can correct the position data. That is, the $M^{th}$-order curve coefficient calculation circuit 51 can calculate the coefficient of the approximate curvy the $M^{th}$-order curve detection error computation circuit 52 can calculate a detection error, and the $M^{th}$-order curve correction computation circuit 53 can correct the position data.

Figure 4:
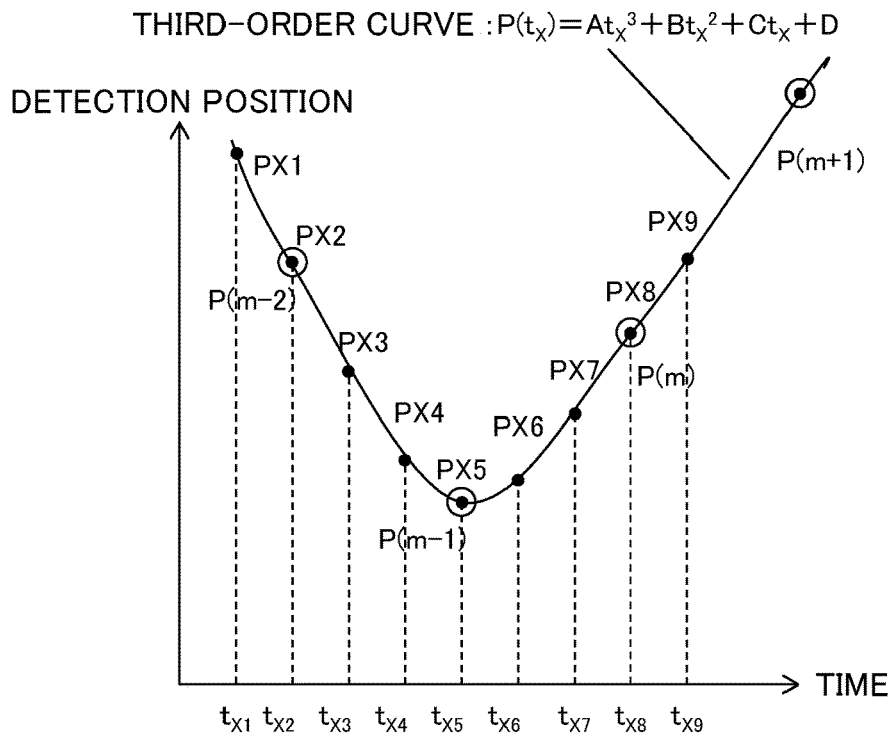
FIG. 4 is a schematic diagram illustrating how an approximate curve of a detection position is drawn from detected position data.

FIG. 4 is a schematic diagram illustrating how an approximate curve of a detection position is drawn from detected position data. FIG. 4 illustrates an example in which the approximate curve of the detection position is drawn by the following third-order curve.

$$P(t_X)=At_X^3+Bt_X^2+Ct_X+D \quad (2)$$

In Equation (1), A, B, C, and D are coefficients. As illustrated in FIG. 4, at positions PX5 to PX8 (between detection points P(m−1) and P(m)), the coefficients of a third-order curve that passes through detection points P(m−2), P(m−1), P(m), and P(m+1), with two of each point located before and after, can be calculated in the following manner.

Figure 5:
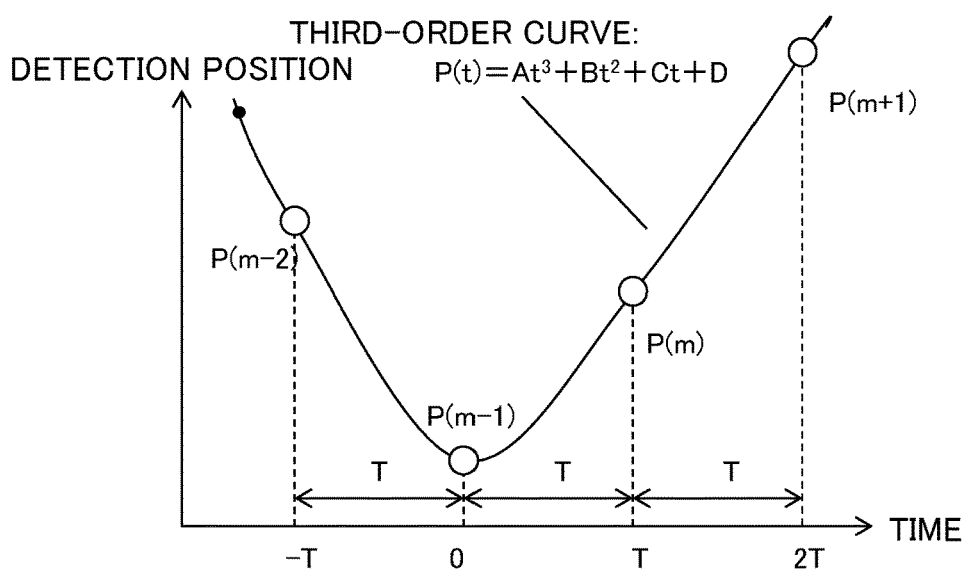
FIG. 5 is a schematic diagram illustrating a relation between detection points used for approximation and an approximate curve.

FIG. 5 is a schematic diagram illustrating a relation between detection points used for approximation and an approximate curve. As illustrated in FIG. 5, when a time point at which a moving object passes through a detection point P(m−1) is t=0, the time points at which the moving object passes through detection points P(m−2), P(m), and P(m+1) at the timings of constant time intervals T are given as −T, T, and 2T. Therefore, the following four equations are satisfied for the coefficients A, B, and D of the third-order curve, $P(t)=At^3+Bt^2+Ct+D$, that passes through the four detection points P(m−2), P(m−1), P(m), and P(m+1).

$$P(m-2)=-AT^3+BT^2CT-D \quad (3)$$

$$P(m-1)=D \quad (4)$$

$$P(m)=AT^3+BT^2+CT+D \quad (5)$$

$$P(m+1)=8AT^3+4BT^2+2CT+D \quad (6)$$

From these four equations, the coefficients A, B, C, and D can be calculated as follows.

$$A=-P(m-2)+3P(m-1)-3P(m)+P(m+1))\div 6T^3 \quad (7)$$

$$B=(P(m-2)-2P(m-1)+P(m))\div 2T^2 \quad (8)$$

$$C=(-2P(m-2)-3P(m-1)+6P(m)-P(m+1))\div 6T^3 \quad (9)$$

$$D=P(m-1) \quad (10)$$

When the coefficients A, B, C, and D are calculated in this manner, the third-order approximate curve P(t) is determined, and the detection error correction circuit 5 can calculate a detection error at an arbitrary time point on the approximate curve P(t) can correct the position data. Therefore, it is possible to suppress a change in velocity components of an error amount and a change in acceleration components of the error amount and alleviate an influence on a torque command of a motor. In this example, coefficients are calculated using the detection points P(m−1) and P(m) as an example. However, at the other detection points P(m−2) and P(m−1) or P(m) and P(m+1), the coefficients of a third-order curve can be calculated similarly on the basis of two detection points before and after the detection point, a detection error at an arbitrary time point can be calculated, and the position data can be corrected.

Comparative Example

Figure 6:
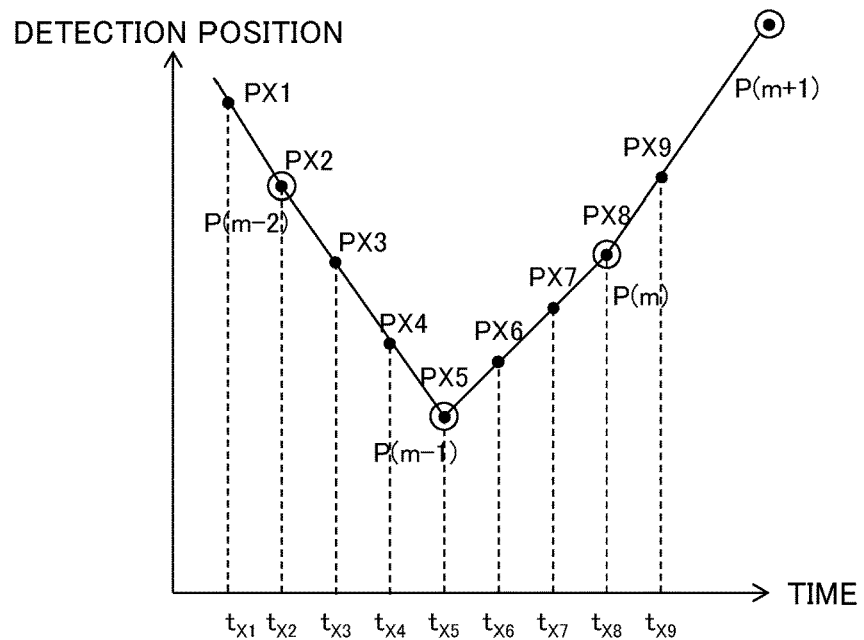
FIG. 6 is a diagram illustrating a case in which detection positions in the example of position data illustrated in FIG. 4 are linearly interpolated.
Figure 7:
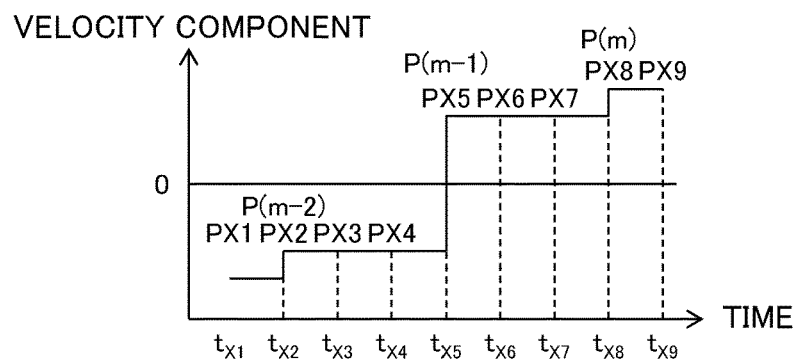
FIG. 7 is a diagram illustrating velocity components at positions PX1 to PX9 in the example of position data illustrated in FIG. 6.
Figure 8:
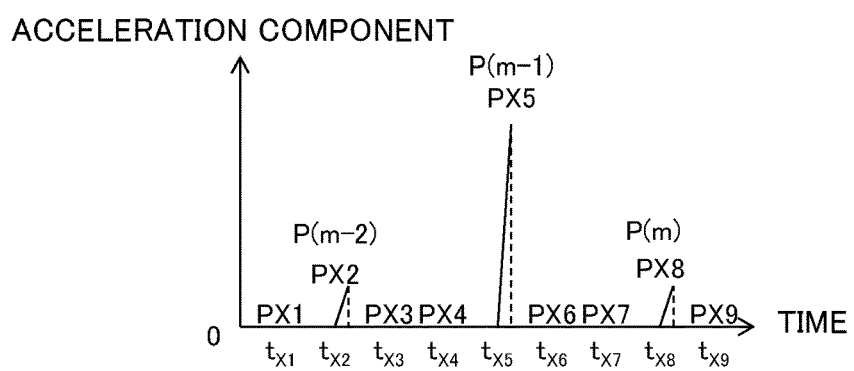
FIG. 8 is a diagram illustrating acceleration components at positions PX1 to PX9 in the example of position data illustrated in FIG. 6.

The encoder signal processing device D having the above-described configuration can suppress a variation in acceleration components which has an influence on a torque command when an error in the output signal of the encoder is corrected as compared to when detection points are linearly interpolated. FIG. 6 is a diagram illustrating a case in which detection positions in the example of position data illustrated in FIG. 4 are linearly interpolated. Moreover, FIG. 7 is a diagram illustrating velocity components at positions PX1 to PX9 in the example of position data illustrated in FIG. 6, and FIG. 8 is a diagram illustrating acceleration components at positions PX1 to PX9 in the example of position data illustrated in FIG. 6. The acceleration components illustrated in FIG. 8 indicate differences at adjacent time points between velocity components at the time points illustrated in FIG. 7. In FIG. 6, since the respective detection points are linearly interpolated, the detection positions between detection points are distributed on an interpolated straight line. In this case, the velocity components at the detection positions between detection points are constant, and the acceleration components are zero.

Figure 9:
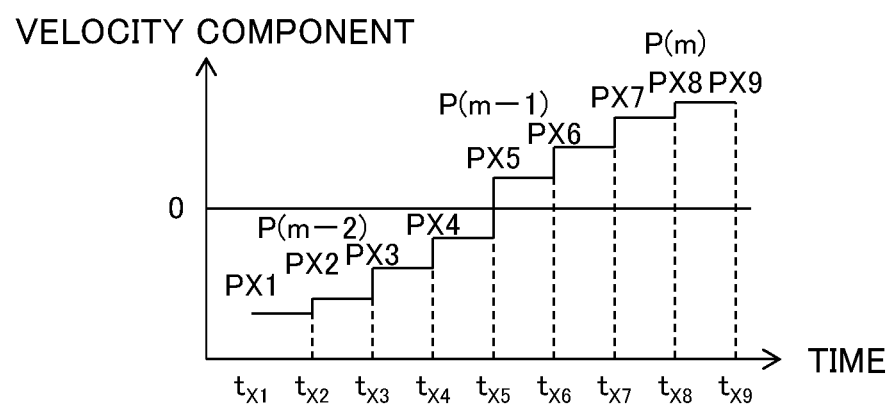
FIG. 9 is a diagram illustrating velocity components at positions PX1 to PX9 in the example of position data illustrated in FIG. 4.
Figure 10:
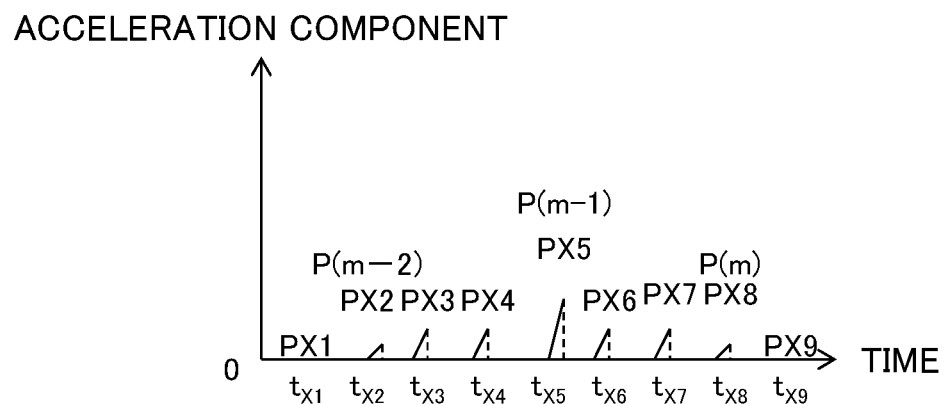
FIG. 10 is a diagram illustrating acceleration components at positions PX1 to PX9 in the example of position data illustrated in FIG. 4.

FIG. 9 is a diagram illustrating velocity components at positions PX1 to PX9 in the example of position data illustrated in FIG. 4. Moreover, FIG. 10 is a diagram illustrating acceleration components at positions PX1 to PX9 in the example of position data illustrated in FIG. 4. The acceleration components illustrated in FIG. 10 indicate differences at adjacent time points between velocity components at the time points illustrated in FIG. 9. In the example of position data illustrated in FIG. 4, the detection positions between detection points are distributed on an approximate curve. In this case, the velocity components at the positions PX1 to PX9 have the same values as illustrated in FIG. 9, and the acceleration components at the positions PX1 to PX9 have the same values as illustrated in FIG. 10.

When the velocity components (FIG. 7) obtained when detection points are linearly interpolated are compared with the velocity components (FIG. 9) obtained when detection points are interpolated according to an approximate curve, it is understood that a large change in the velocity components is suppressed when the detection points are interpolated according to an approximate curve as in the present invention. Similarly, when the acceleration components (FIG. 8) obtained when detection points are linearly interpolated are compared with the acceleration components (FIG. 10) obtained when detection points are interpolated according to an approximate curve, it is understood that a large change in the acceleration components is suppressed when the detection points are interpolated according to an approximate curve as in the present invention.

Second Embodiment

Next, a second embodiment of the present invention will be described. In the second embodiment, the order of the approximate curve illustrated in the first embodiment is set to an odd-number order in order to be able to correct position data appropriately even when an encoder rotates in a backward direction.

Figure 11:
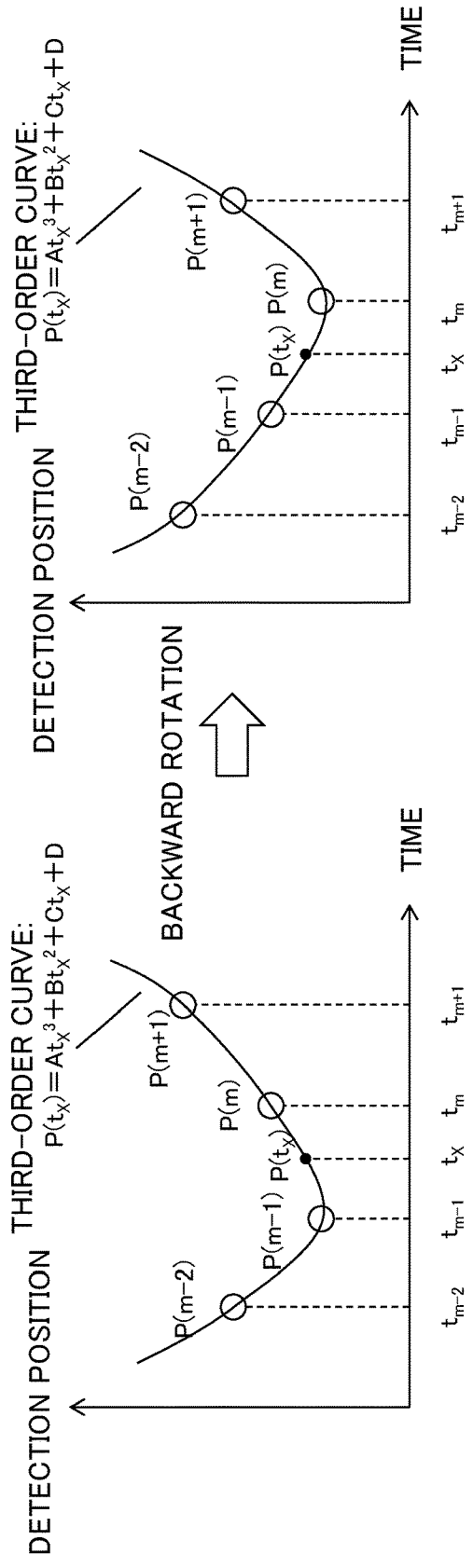
FIG. 11 is a schematic diagram illustrating detection points used for calculation of coefficients for forward and backward rotation when the order of an approximate curve is an odd-number order (in this example, a third order).

FIG. 11 is a schematic diagram illustrating detection points used for calculation of coefficients for forward and backward rotation when the order of an approximate curve is an odd-number order (in this example, a third order). The detection positions for forward rotation in FIG. 6 and the detection positions for backward rotation are bilaterally reversed. As illustrated in FIG. 11, when the order of an approximate curve is a third order, it is possible to calculate the coefficients A, B, C, and D of the third-order curve using four detection points each located before and after a target time point $t_X$ and to calculate a detection error $P(t_X)$ at an arbitrary time point within the range of $t_{m-1} \le t_X \le t_m$ as follows.

$$P(t_X)=At_X^3+Bt_X^2+Ct_X-D$$

Moreover, in the case of reverse rotation, since the same four detection points located before and after the target time point as used for the forward rotation are used, the coefficients of the approximate curve are determined uniquely.

Figure 12:
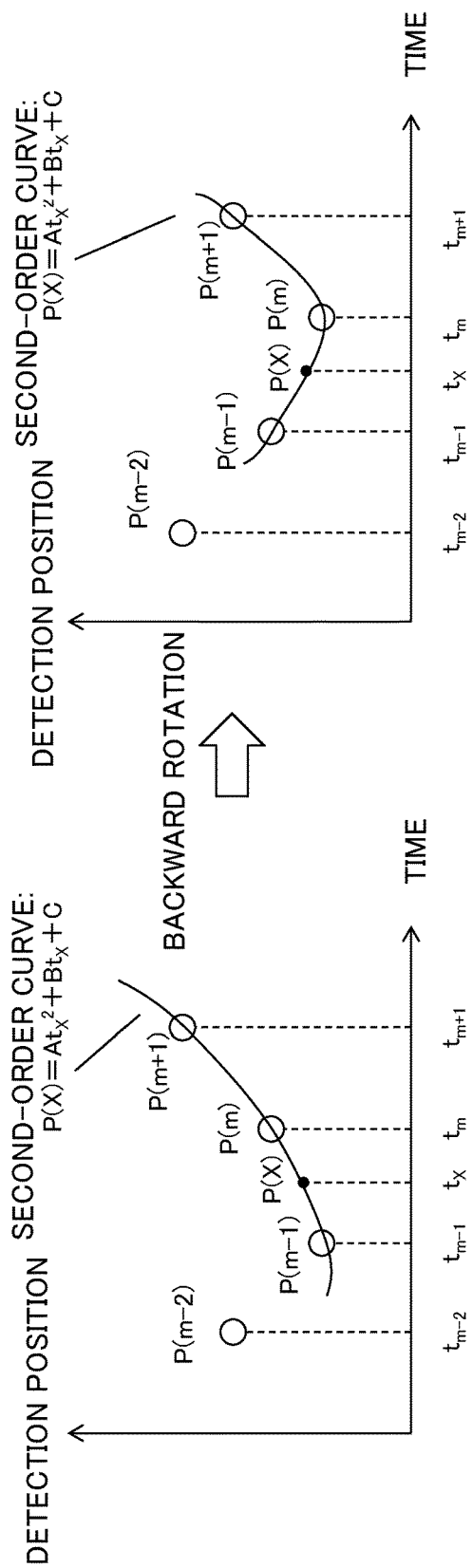
FIG. 12 is a schematic diagram illustrating detection points used for calculation of coefficients for forward and backward rotation when the order of an approximate curve is an even-number order (in this example, a second order).

FIG. 12 is a schematic diagram illustrating detection points used for calculation of coefficients for forward and backward rotation when the order of an approximate curve is an even-number order (in this example, a second order). The detection positions for forward rotation in FIG. 12 and the detection positions for backward rotation are bilaterally reversed. When the order of an approximate curve is a second order, it is possible to calculate the coefficients A, B, and C of a second-order curve according to the following equations using one detection point of a time point $t_{m-1}$ located before a target time point $t_X$ and two detection points of time points $t_m$ and $t_{m+1}$ located after the time point $t_X$.

$$A=(P(m-1)-2P(m)+P(m+1))\div 2 \quad (11)$$

$$B=(-P(m-1)+2P(m+1))\div 2 \quad (12)$$

$$C=P(m) \quad (13)$$

Using these coefficients, a detection error $P(t_X)$ at an arbitrary time point within the range of $t_{m-1} \le t_X \le t_m$ can be calculated as follows.

$$P(t_X)=At_X^2+Bt_X+C \quad (14)$$

However, in the case of backward rotation, when one detection point at the time point $t_{m-1}$ located before the target time point $t_X$ and two detection points at the time points $t_m$ and $t_{m-1}$ located after the time point $t_X$ are used similarly to the forward rotation, the coefficients of a second-order curve that passes through three different points must be calculated. Therefore, when the encoder rotates in the backward direction, it may be impossible to correct the position data appropriately. That is, by setting the order of the approximate curve to an odd-number order, it is possible to correct the position data more appropriately.

Third Embodiment

Figure 13:
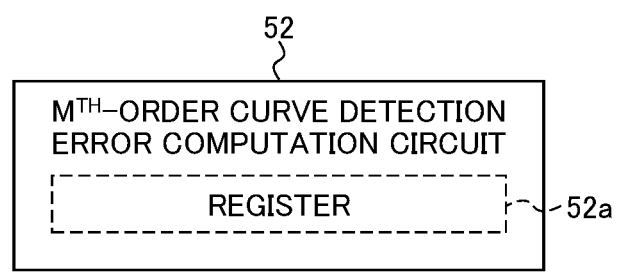
FIG. 13 is a schematic diagram illustrating a configuration of an $M^{th}$-order curve detection error computation circuit according to a third embodiment.
Figure 14:
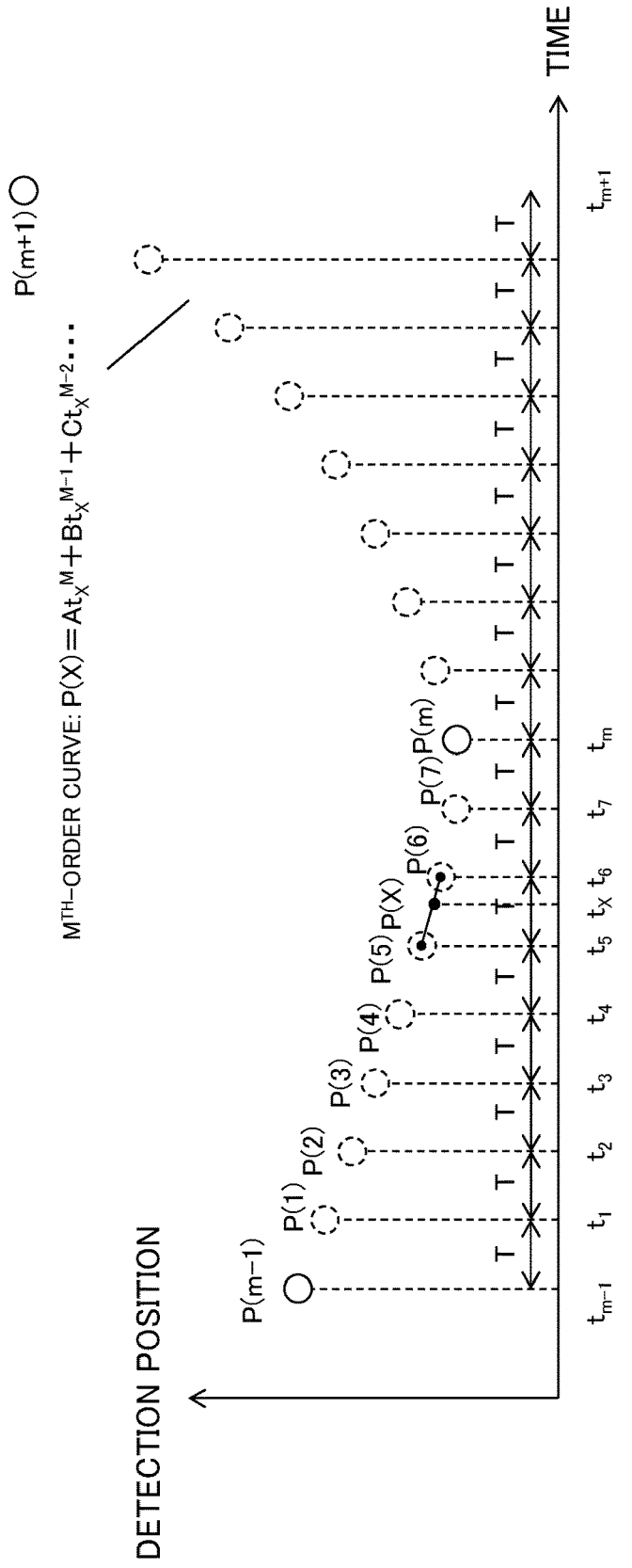
FIG. 14 is a schematic diagram illustrating how, in an $M^{th}$-order curve that passes through detection points, a detection error at a time point when adjacent two detection points were evenly divided is calculated in advance.

Next, a third embodiment of the present invention will be described. In the third embodiment, in order to simplify computation of a detection error and to accelerate processing, a predetermined detection error of an approximate curve is calculated and stored in advance. FIG. 13 is a schematic diagram illustrating a configuration of the $M^{th}$-order curve detection error computation circuit 52 according to the present embodiment. Moreover, FIG. 14 is a schematic diagram illustrating how, in an $M^{th}$-order curve that passes through the detection points, a detection error at a time point when detection points were evenly divided is calculated in advance.

As illustrated in FIG. 13, the $M^{th}$-order curve detection error computation circuit 52 of the present embodiment includes a register 52a and can store a predetermined calculated detection error in the register 52a. As illustrated in FIG. 14, the $M^{th}$-order curve detection error computation circuit 52 calculates in advance a detection error that passes through an $M^{th}$-order curve at a time point when detection points were evenly divided and stores the calculated detection error in the register 52a. In FIG. 14, an example in which a period T between detection points P(m−1) and P(m) is evenly divided by eight segments and detection errors P(1) to P(7) on an $M^{th}$-order curve at respective time points t1 to t7 are calculated is illustrated. These detection errors P(1) to P(7) are stored in the register 52a.

The $M^{th}$-order curve detection error computation circuit 52 calculates a detection error at an arbitrary time point by linearly interpolating a period including an arbitrary time point using detection errors at time points before and after the arbitrary time point when calculating the detection error at the arbitrary time point. For example, when a detection error P(X) is calculated by linearly interpolating a period between time points t5 and t6 in FIG. 14, the detection error P(X) can be calculated as follows using detection errors P(5) and P(6).

$$P(X) = (P(6) - P(5)) \times (t_X - t5) \div T + P(5) \quad (15)$$

By calculating the detection error in this manner, it is possible to simplify computation and to accelerate processing as compared to when detection errors on the $M^{th}$-order curve at an arbitrary time point are calculated sequentially.

Modification 1

In the embodiments described above, the start condition determination circuit 41 is provided in the detection error data calculation circuit 4, and a data read command to the register group 42 and a reference data calculation command are output on the basis of a determination result obtained by the start condition determination circuit 41. However, the start condition determination circuit 41 may not be provided, and a controller such as a numerical controller that controls a machine or a device where this encoder is installed may determine a start condition, and the controller may output a data read command and a reference data calculation command.

Modification 2

Figure 15:
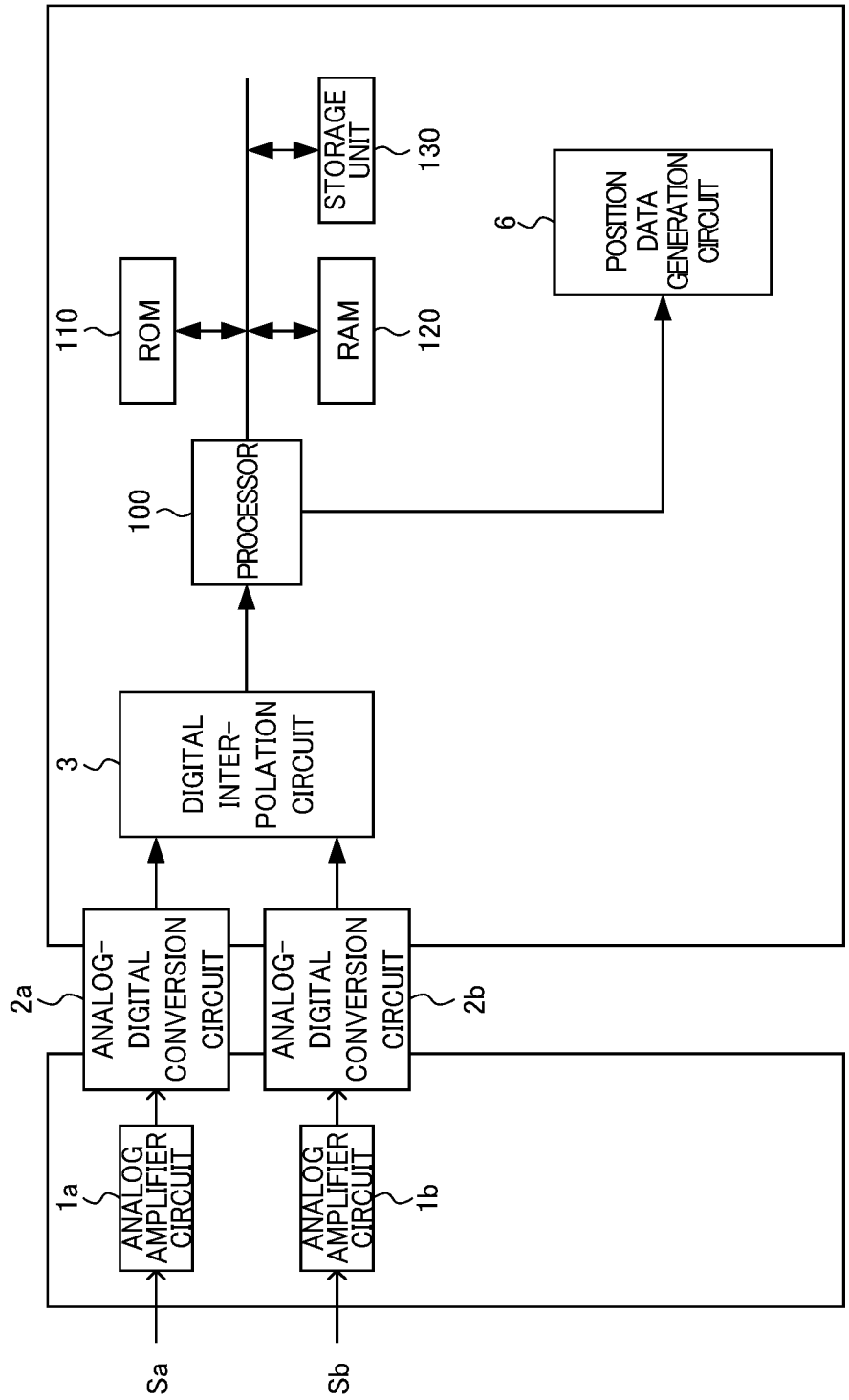
FIG. 15 is a block diagram illustrating a configuration when a detection error data calculation process and a position data correction process are executed by software.

In the embodiments described above, the detection error data calculation circuit 4 and the detection error correction circuit 5 may be configured as processors and processing may be performed by software. FIG. 15 is a block diagram illustrating a configuration when a detection error data calculation process and a position data correction process are executed by software.

As illustrated in FIG. 15, when a detection error data calculation process and a position data correction process are executed by software, the encoder signal processing device D according to the present invention includes a processor 100, a read-only memory (ROM) 110, a random-access memory (RAM) 120, and a storage unit 130 instead of the detection error data calculation circuit 4 and the detection error correction circuit illustrated in FIG. 1.

The processor 100 executes a program for a detection error data calculation process and a program for a position data correction process, stored in the ROM 110 or the storage unit 130. Various programs for controlling the encoder signal processing device D are written in advance in the ROM 110. The RAM 120 is configured by a semiconductor memory such as a dynamic random-access memory (DRAM) and stores data generated when the processor 100 executes various processes.

The storage unit 130 is configured by a nonvolatile storage device such as a hard disk or a flash memory and stores various programs such as a program for a detection error data calculation process and a program for a position data correction process and various items of data used in the encoder signal processing device D.

Figure 16:
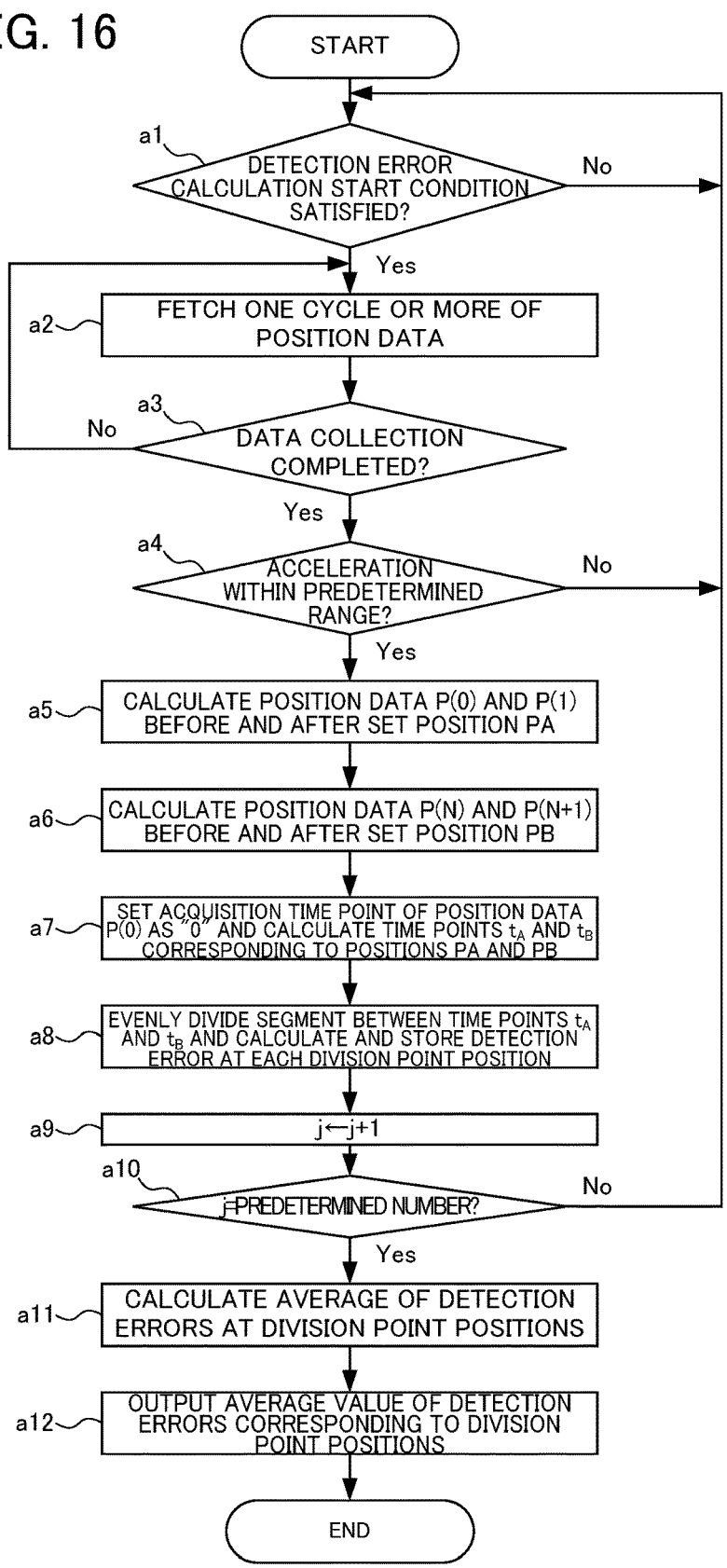
FIG. 16 is a flowchart illustrating the flow of a detection error data calculation process (a process equivalent to a process performed by a detection error data calculation circuit) executed by a processor.

FIG. 16 is a flowchart illustrating the flow of a detection error data calculation process (a process equivalent to the process performed by the detection error data calculation circuit 4) executed by the processor 100. First, when a reference data creation command is input manually or as a command from a controller that controls a machine or a device where the encoder is installed, the processor 100 determines whether a predetermined detection error calculation start condition is satisfied on the basis of sampling position data output from the digital interpolation circuit 3. That is, it is determined whether a current velocity is a predetermined value or a current acceleration is within a predetermined value (step a1).

When it is determined that the predetermined detection error calculation start condition is satisfied, one cycle or more of the sampling position data output from the digital interpolation circuit 3 are fetched (steps a2 and a3). When fetching of the position data is completed, it is determined whether an acceleration at the time of completion of fetching of one cycle of position data is within a predetermined range (step a4). If the acceleration is outside the predetermined range, since this means that there is a change in velocity within one cycle in which the position data are acquired, the flow returns to step a1 and position data are fetched again.

When it is determined in step a4 that the acceleration is within the predetermined range, the fetched position data are regarded as constant velocity data, and position data P(0) and P(1) and P(n) and P(n−1) at a setting position PA and the positions located before and after a setting position PB which is one cycle later than the position PA are calculated from the fetched position data (steps a5 and a6). A sampling time point of the position data P(0) is set to time point "0" and the time points tA and tB corresponding to the positions PA and PB are calculated by interpolation (step a7), in steps a6 and a7, when the position PA is set as a detection position immediately after a zero-crossing point, the time points tA and tB are "0" and the product of the sampling cycle Ts and the number of samplings n, respectively, and interpolation is not necessary. On the other hand, when the position PA is set to an arbitrary position in a sampling cycle, the time point tA can be calculated by interpolation (for example, linear interpolation) from position data P(0) and P(1) located before and after the position PA. Similarly, the time point tB can be calculated by interpolation from position data P(n) and P(n+1) located before and after the position PB which is one cycle later than the position PA.

A period between the time points tA and tB is evenly divided and position data which are expected to be detected at respective division points are calculated similarly by interpolation. Moreover, a detection error at the expected detection position (division point position) is calculated, and the expected detection position (division point position) and the detection error corresponding thereto are stored in correlation (step a8).

An index j is incremented by "1" (the index j is set to "0" as an initial value), and it is determined whether the value of the index j has reached a predetermined number (steps a9 and a10). If the value of the index j has not reached the predetermined number, the flow returns to step a1. When the processes of steps a1 to a10 are repeatedly performed and the index j reaches the predetermined number, an average of j detection errors stored in relation to the expected detection positions (division point positions) is calculated (step a11), a set composed of the expected detection positions (division point positions) and the average of the detection errors is output to the $M^{th}$-order curve coefficient calculation circuit 51 (step a12), and the detection error data calculation process ends.

Figure 17:
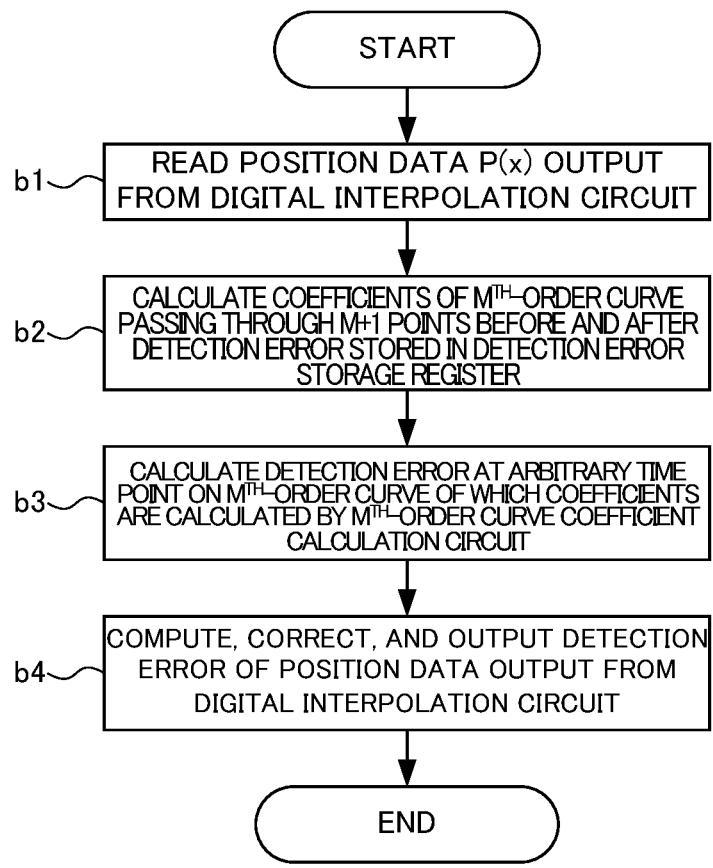
FIG. 17 is a flowchart illustrating the flow of a position data correction process (a process equivalent to a process performed by a detection error correction circuit) executed by a processor.

FIG. 17 is a flowchart illustrating the flow of a position data correction process (a process equivalent to the process performed by the detection error correction circuit 5) executed by the processor 100. When the position data correction process starts, the detection error correction circuit 5 reads position data P(x) which is the output of the digital interpolation circuit 3 (step b1), and the $M^{th}$-order curve coefficient calculation circuit 51 calculates the coefficients of an $M^{th}$-order curve that passes through M+1 points located before and after the detection error stored in the detection error storage register 44 (step b2).

Subsequently, the $M^{th}$-order curve detection error computation circuit 52 calculates a detection error at an arbitrary time point on the $M^{th}$-order curve of which the coefficients are calculated by the $M^{th}$-order curve coefficient calculation circuit 51 (step b3). Subsequently, the $M^{th}$-order curve correction computation circuit 53 computes and corrects the detection error of the position data output from the digital interpolation circuit 3 using the detection error calculated by the $M^{th}$-order curve detection error computation circuit 52 and outputs the detection error to the position data generation circuit 6 (step b4). After that, the position data generation circuit 6 generates position data on the basis of the corrected position data (the corrected position data within one cycle) output in this manner and the data output from a counter that measures the cycle of an original signal. With this configuration, the functions of the detection error data calculation circuit 4 and the detection error correction circuit 5 can be configured by software, and additions or changes to the functions can be performed more flexibly.

The present invention is not limited to the above-described embodiments but can be changed appropriately. For example, in the detection error correction circuit 5, the order of the $M^{th}$-order curve calculated as an approximate curve may be determined appropriately depending on a specific application target of the present invention. Moreover, the sampling cycle of sampling the position data P(n) may be determined appropriately depending on the required accuracy of the approximate curve or the like.

The encoder signal processing device D according to the embodiments described above may be implemented entirely or partially by hardware, software, or a combination thereof. Here, implementing the encoder signal processing device by software means that the encoder signal processing device is implemented by a computer reading and executing a program. When the encoder signal processing device D is configured by hardware, the encoder signal processing device D may be configured entirely or partially by an integrated circuit (IC) such as a large-scale integrated circuit (LSI), an application specific integrated circuit (ASIC), a gate array, or a field-programmable gate array (FPGA), for example.

When the encoder signal processing device D is configured entirely or partially by software, the encoder signal processing device D may be implemented by a computer that includes a storage unit such as a hard disk or a ROM storing a program that describes an entire part or a partial part of the operation of the encoder signal processing device D, a DRAM storing data necessary for operations, a CPU, and a bus that connects respective units, the computer storing the information necessary for operations in the DRAM and causing the CPU to operate the program.

These programs may be stored using various types of computer-readable media and be supplied to the computer. The computer-readable media include various types of tangible storage media. Examples of computer-readable media include a magnetic recording medium (for example, a flexible disk, magnetic tape, or a hard disk drive), a magneto-optical recording medium (for example, a magneto-optical disk), a CD read-only memory (CD-ROM), a CD-R, a CD-R/W, and a semiconductor memory (for example, a mask ROM, a programmable ROM (PROM), an erasable PROM (EPROM), a flash ROM, or a random-access memory (RAM)). Moreover, these programs may be distributed by being downloaded to a user's computer via a network.

While the embodiments of the present invention have been described in detail, the embodiments merely illustrate specific examples of how the present invention is implemented. The technical scope of the present invention is not limited to the above-described embodiments. Various changes can be made without departing from the scope of the present invention, and these changes also fall within the technical scope of the present invention.

EXPLANATION OF REFERENCE NUMERALS

D Encoder signal processing device
1a, 1b Analog amplifier circuit
2a, 2b Analog-digital conversion circuit
3 Digital interpolation circuit
4 Detection error data calculation circuit
41 Start condition determination circuit
42 Register group
43 Detection error computation circuit
44 Detection error storage register
45 Averaging circuit
5 Detection error correction circuit
51 $M^{th}$-order curve coefficient calculation circuit
52 $M^{th}$-order curve detection error computation circuit
52a Register
53 $M^{th}$-order curve correction computation circuit
6 Position data generation circuit
411a, 411b, 411c Position data register
412a First velocity computation circuit
412b Second velocity computation circuit
413 Zero-crossing point detection circuit
414 Acceleration computation circuit
415 Position data register storage start determination and error computation start signal determination circuit
100 Processor
110 ROM
120 RAM
130 Storage unit

What is claimed is:

1. An encoder signal processing device that detects position data at every predetermined time interval from an original signal which is an analog amount generated in an encoder according to movement of a measurement target, the encoder signal processing device comprising:
    an approximate curve calculation unit that calculates an approximate curve of a detection position on the basis of the position data at at least three or more points acquired at equal intervals within one cycle of the original signal generated by the encoder;
    an approximate error computation unit that computes an approximate value of a detection error of the position data at an arbitrary time point on the basis of the approximate curve of the detection position calculated by the approximate curve calculation unit; and
    a position data correction unit that corrects the detection error of the position data at the arbitrary time point on the basis of the approximate value of the detection error of the position data computed by the approximate error computation unit.

2. The encoder signal processing device according to claim 1, wherein
    the approximate curve calculation unit calculates a detection position approximate curve that approximates detection position at an arbitrary time point within (M+1) points (M≥2) from the position data at the (M+1) points located before and after an arbitrary time point among the time points obtained by evenly dividing a period between items of position data at both ends of a position data group at predetermined time intervals, the position data group being composed of at least three items of continuously detected (n+1) position data (n≥2), when the measurement target moves within a predetermined velocity range having a velocity variation within a predetermined value, and calculates detection errors of the position within the (M+1) points.

3. The encoder signal processing device according to claim 2, wherein
the approximate curve calculation unit calculates an $M^{th}$-order curve that passes through the (M+1) points as the approximate curve of the detection position.

4. The encoder signal processing device according to claim 3, wherein
the $M^{th}$-order curve is an odd-number-order curve.

5. The encoder signal processing device according to claim 1, wherein
the approximate error computation unit calculates and stores detection errors at positions located at equal intervals on the basis of the approximate curve of the detection position in advance and linearly interpolates the stored detection errors to calculate the detection error at the arbitrary position.

6. An encoder that detects position data at every predetermined time interval from an original signal which is an analog amount generated according to movement of a measurement target, the encoder comprising:
an approximate curve calculation unit that calculates an approximate curve of a detection position on the basis of the position data at at least three or more points acquired at equal intervals within one cycle of the original signal generated by the encoder;
an approximate error computation unit that computes an approximate value of a detection error of the position data at an arbitrary time point on the basis of the approximate curve of the detection position calculated by the approximate curve calculation unit; and
a position data correction unit that corrects the detection error of the position data at the arbitrary time point on the basis of the approximate value of the detection error of the position data computed by the approximate error computation unit.

7. An encoder signal processing method for detecting position data at every predetermined time interval from an original signal which is an analog amount generated in an encoder according to movement of a measurement target, the encoder signal processing method comprising:
an approximate curve calculation step of calculating an approximate curve of a detection position on the basis of the position data at at least three or more points acquired at equal intervals within one cycle of the original signal generated by the encoder;
an approximate error computation step of computing an approximate value of a detection error of the position data at an arbitrary time point on the basis of the approximate curve of the detection position calculated in the approximate curve calculation step; and
a position data correction step of correcting the detection error of the position data at the arbitrary time point on the basis of the approximate value of the detection error of the position data computed in the approximate error computation step.

8. A non-transitory computer-readable recording medium storing a program for causing a computer that forms an encoder signal processing device that detects position data at every predetermined time interval from an original signal which is an analog amount generated in an encoder according to movement of a measurement target to implement:
an approximate curve calculation function of calculating an approximate curve of a detection position on the basis of the position data at at least three or more points acquired at equal intervals within one cycle of the original signal generated by the encoder;
an approximate error computation function of computing an approximate value of a detection error of the position data at an arbitrary time point on the basis of the approximate curve of the detection position calculated by the approximate curve calculation function; and
a position data correction function of correcting the detection error of the position data at the arbitrary time point on the basis of the approximate value of the detection error of the position data computed by the approximate error computation function.

* * * * *